(12) United States Patent
Dong et al.

(10) Patent No.: US 11,011,551 B2
(45) Date of Patent: May 18, 2021

(54) ARRAY SUBSTRATE WITH A PLURALITY OF DIFFERENT SIGNAL LINES

(71) Applicants: BOE TECHNOLOGY GROUP CO., LTD., Beijing (CN); CHENGDU BOE OPTOELECTRONICS TECHNOLOGY CO., LTD., Chengdu (CN)

(72) Inventors: Xiangdan Dong, Beijing (CN); Young Yik Ko, Beijing (CN); Jinsan Park, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 508 days.

(21) Appl. No.: 15/751,410

(22) PCT Filed: Aug. 9, 2017

(86) PCT No.: PCT/CN2017/096598
§ 371 (c)(1),
(2) Date: Feb. 8, 2018

(87) PCT Pub. No.: WO2018/149100
PCT Pub. Date: Aug. 23, 2018

(65) Prior Publication Data
US 2020/0266215 A1      Aug. 20, 2020

(30) Foreign Application Priority Data

Feb. 17, 2017 (CN) .......................... 201710087430.5

(51) Int. Cl.
*H01L 23/12* (2006.01)
*H01L 23/48* (2006.01)
(Continued)

(52) U.S. Cl.
CPC ...... *H01L 27/124* (2013.01); *H01L 23/49827* (2013.01); *H01L 23/49838* (2013.01);
(Continued)

(58) Field of Classification Search
CPC ............... H01L 27/124; H01L 27/3279; H01L 51/0097; H01L 23/49838; H01L 23/49827; H01L 23/5226; H05K 1/89; H05K 1/189
See application file for complete search history.

(56) References Cited

U.S. PATENT DOCUMENTS

2003/0051910 A1* 3/2003 Dyke ................ H01L 23/49822
174/262
2010/0033664 A1   2/2010 Lee
(Continued)

FOREIGN PATENT DOCUMENTS

| CN | 101841004 A | 9/2010 |
| CN | 103715205   | 4/2014 |

(Continued)

OTHER PUBLICATIONS

First Office Action for CN Appl. No. 201710087430.5, dated Dec. 21, 2018.
(Continued)

*Primary Examiner* — Alonzo Chambliss
(74) *Attorney, Agent, or Firm* — Dinsmore & Shohl LLP (57) ABSTRACT

An array substrate and display apparatus, the array substrate comprising a base substrate (10) and signal lines (VDD, VSS) provided on the base substrate (10), wherein at least one electrically conductive element (12) corresponding to the signal lines (VDD, VSS) is further provided on the base substrate (10), the signal lines (VDD, VSS) are connected in parallel with corresponding electrically conductive elements (12), and the electrically conductive elements (12) corre-
(Continued)

sponding to different signal lines (VDD, VSS) are insulated from one another. Thus, resistance of the signal lines (VDD, VSS) can be reduced and the display effect can be improved.

12 Claims, 5 Drawing Sheets

(51) Int. Cl.
| | |
|---|---|
| H01L 21/00 | (2006.01) |
| H01L 21/4763 | (2006.01) |
| H01L 27/12 | (2006.01) |
| H01L 27/32 | (2006.01) |
| H05K 1/18 | (2006.01) |
| H01L 23/498 | (2006.01) |
| H01L 51/00 | (2006.01) |
| H01L 23/522 | (2006.01) |

(52) U.S. Cl.
CPC ...... *H01L 23/5226* (2013.01); *H01L 27/3279* (2013.01); *H01L 51/0097* (2013.01); *H05K 1/189* (2013.01); *H05K 2201/10128* (2013.01)

(56) References Cited

U.S. PATENT DOCUMENTS

| | | | | |
|---|---|---|---|---|
| 2012/0098137 A1* | 4/2012 | Usui | ...................... | H05K 3/445 257/771 |
| 2012/0169699 A1 | 7/2012 | Shin | | |
| 2012/0325542 A1* | 12/2012 | Yokoyama | ........... | H05K 1/0251 174/262 |
| 2013/0038581 A1 | 2/2013 | Yagi | | |
| 2015/0021081 A1 | 1/2015 | Mitarai et al. | | |
| 2015/0144925 A1* | 5/2015 | Baek | ................... | H01L 51/5265 257/40 |
| 2015/0318305 A1 | 11/2015 | Zhang et al. | | |
| 2015/0372017 A1* | 12/2015 | Yagi | ...................... | H01L 27/124 257/774 |
| 2016/0063912 A1 | 3/2016 | Zhang et al. | | |
| 2016/0073528 A1 | 3/2016 | Park et al. | | |
| 2016/0181328 A1* | 6/2016 | Zhang | ................. | H01L 51/5237 257/40 |
| 2016/0254341 A1* | 9/2016 | Zhang | ..................... | H01L 27/32 257/40 |
| 2017/0148826 A1* | 5/2017 | Choi | ................... | H01L 27/1244 |

FOREIGN PATENT DOCUMENTS

| | | |
|---|---|---|
| CN | 104103669 A | 10/2014 |
| CN | 104752439 A | 7/2015 |
| CN | 105976701 A | 9/2016 |
| CN | 106653819 A | 5/2017 |
| JP | H11161207 A | 6/1999 |
| WO | 2004023575 A1 | 3/2004 |

OTHER PUBLICATIONS

Second Office Action for CN Appl. No. 201710087430.5, dated Jun. 13, 2019.
International Search Report and Written Opinion for International Appl. No. PCT/CN2017/096598, dated Nov. 29, 2017.
First Examination Report in IN Appl. No. 201837004949, dated Oct. 21, 2019.
Partial European search report for European Patent Application No. EP17835995.1, dated Nov. 4, 2020.

\* cited by examiner

ARRAY SUBSTRATE WITH A PLURALITY OF DIFFERENT SIGNAL LINES

CROSS REFERENCE TO RELATED APPLICATIONS

This application is a U.S. National Stage under 35 U.S.C. § 371 of PCT/CN2017/096598, filed on Aug. 9, 2017, which claims priority to Chinese Application No. 201710087430.5 filed on Feb. 17, 2017, the disclosure of which is hereby incorporated by reference in its entirety as a part of this application.

FIELD

The embodiments of the present disclosure relate to an array substrate and display apparatus.

BACKGROUND

In an Organic Light-Emitting Diode (OLED) display device, an organic light emitting unit and a pixel circuit for supplying a drive current to the organic light emitting unit are provided in each pixel unit. The pixel circuit has a high level signal terminal and a low level signal terminal for receiving a high level signal and a low level signal respectively. The high level signal and the low level signal are supplied from a high level signal line and a low level signal line respectively. At present, due to high resistance values of the high level signal line and the low level signal line, pixel circuits in different regions may receive different signals, so that the organic light emitting units in different regions have different brightness, affecting uniformity of display.

SUMMARY

An embodiment of the present disclosure provides a base substrate and signal lines provided on the base substrate, at least one electrically conductive element corresponding to the signal lines is further provided on the base substrate, the signal lines are connected in parallel with the corresponding electrically conductive element, and the electrically conductive elements corresponding to different signal lines are insulated and spaced apart from one another.

For example, an organic light emitting unit is further provided on the base substrate, and the signal lines comprise a high level signal line and/or a low level signal line.

For example, the signal lines and the electrically conductive elements are disposed on two sides of the base substrate along its thickness direction respectively. At least two vias are formed in a region on the base substrate corresponding to each signal line. Connectors corresponding to the vias are further provided on the base substrate. Each connector passes through the via to connect the signal line in parallel with the corresponding electrically conductive element.

For example, the base substrate is a flexible base substrate.

For example, the connector comprises an electrically conductive silver paste.

For example, the electrically conductive elements and the signal lines are disposed on the same side of the base substrate along its thickness direction. An insulation and spacing layer is provided between the electrically conductive elements and the signal lines. At least two vias are formed in a region on the insulation and spacing layer corresponding to each signal line. Connectors corresponding to the vias are further provided on the base substrate. Each connector passes through the via to connect the signal line in parallel with a corresponding electrically conductive element.

For example, the material of the electrically conductive element comprises a two-layer structure of conductive materials of copper and graphite.

Correspondingly, another embodiment of the present disclosure provides a display apparatus including the above array substrate provided in the present disclosure.

Correspondingly, a still another embodiment of the present disclosure further provides a display apparatus comprising the array substrate described above, wherein the signal lines and the electrically conductive elements are disposed on two sides of the base substrate along its thickness direction respectively. The display apparatus further comprises a flexible circuit broad comprising connection lines corresponding to the signal lines. One end of the signal line is connected to the electrically conductive element by a corresponding connection line on the flexible circuit broad. Another end of the signal line is connected to the electrically conductive element through at least one via.

For example, a portion of the flexible circuit broad is disposed on the side of the base substrate where the signal lines are formed and is electrically connected to the signal lines. Another portion of the flexible circuit broad is folded to the side of the base substrate where the electrically conductive elements are formed and is electrically connected to the electrically conductive elements.

For example, the flexible circuit broad comprises a flexible base. The connection lines are disposed on a side of the flexible base facing the array substrate. An insulation layer is further provided on the flexible base. The insulation layer covers the connection lines and exposes a first predetermined connection region and a second predetermined connection region. The first predetermined connection region is a region connected to the signal lines. The second predetermined connection region is a region connected to the electrically conductive elements. The second predetermined connection region is connected to the electrically conductive elements by the connectors.

For example, the at least one via is formed on the base substrate and corresponds to the signal line. Connectors are further provided on the base substrate corresponding to the via. Each connector passes through the corresponding via to connect a portion of the signal line that is not connected to the connection line to a corresponding electrically conductive element.

For example, the connector comprises an electrically conductive silver paste.

For example, the base substrate of the array substrate is a flexible base substrate.

BRIEF DESCRIPTION OF THE DRAWINGS

For a more clear illustration of the technical solution of the embodiments of the present disclosure, a brief description of the drawings of the embodiments will be given below. It is apparent that the following description of the drawings merely involve some embodiments of the present disclosure, and is not a limitation of the present disclosure.

FIG. 1b is a rear view of the structure corresponding to FIG. 1a;

FIG. 1c is a schematic view of the array substrate shown in FIG. 1a;

FIG. 2a is the sectional view along the line A-A' as shown in FIG. 1a;

FIG. 2b is a schematic structure view after a first via is formed in a process of fabricating the structure shown in FIG. 1a;

FIG. 3b is a rear view of the structure corresponding to FIG. 3a;

FIG. 4b is a rear view of the structure corresponding to FIG. 4a;

FIG. 5a is the sectional view along the line B-B' as shown in FIG. 4a;

REFERENCE NUMERALS 10 base substrate; 11 first connector; 12 electrically conductive element; VDD high level signal line; VSS low level signal line; VSS1 signal transmission section; VSS2 connection section; V1 first via; V3 third via; 20 flexible circuit broad; 21 connection line; 22 flexible base; 23 third connector; 24 insulation layer; 100 pixel unit; 101 organic light emitting unit; 102 pixel driving circuit.

DETAILED DESCRIPTION

In order to make the objectives, technical schemes and advantages of the embodiments of the present disclosure more clear, a clear and complete description will be given below for the technical solutions of the embodiments of the present disclosure with reference to the drawings. Obviously, embodiments described are only some embodiments of the present disclosure, and are not all of embodiments thereof. All other embodiments obtained by persons of ordinary skill in the art based on the embodiments of the present disclosure without creative efforts shall fall within the protection scope of the present disclosure. An embodiment of the present disclosure provides an array substrate used in a display apparatus, for example, an OLED display apparatus. Refer to FIGS. 1a to 3b, the array substrate comprises a base substrate 10 and signal lines provided on the base substrate 10 (for example, a high level signal line VDD and a low level signal line VSS shown in FIG. 1a). Electrically conductive elements 12 corresponding to the signal lines are further provided on the base substrate 10. The signal lines are connected in parallel with their corresponding electrically conductive elements 12, and electrically conductive elements 12 corresponding to different signal lines are insulated from one another. Connecting a signal line in parallel with a corresponding electrically conductive element 12 means that at least two different locations on the signal line are correspondingly connected to two different locations on the electrically conductive element, so that the resistance of the parallel-connected structure of the signal line and the electrically conductive element 12 is less than the resistance of the signal line itself.

The signal line is used to provide electrical signals to pixel units. If the signal line has a large resistance value, the partial voltage on the signal line is large. Thus, even in a case of trying to display at the same brightness, pixel units at different regions of a display apparatus adopting such an array substrate may receive different electrical signals, resulting in different actual brightness at different regions and lowered display uniformity. However, in the present embodiment, since the signal line is parallel-connected with the electrically conductive element 12, it is equivalent to parallel-connecting a resistor to the signal line, thereby the resistance of the signal line can be reduced and the partial voltage on the signal line is reduced. In this way, there are smaller differences between electrical signals received by pixel units at different positions on the array substrate, and in turn the display uniformity can be improved.

Figure 1A:
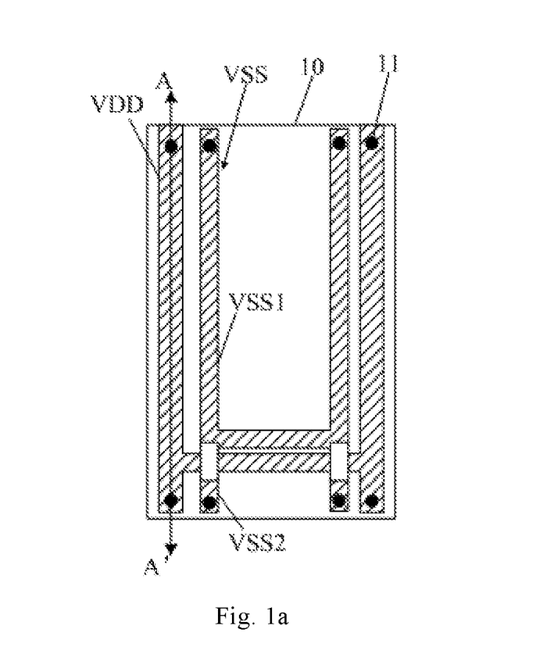
FIG. 1a is a front view of the structure of an array substrate provided in a first embodiment of the present disclosure.
Figure 1B:
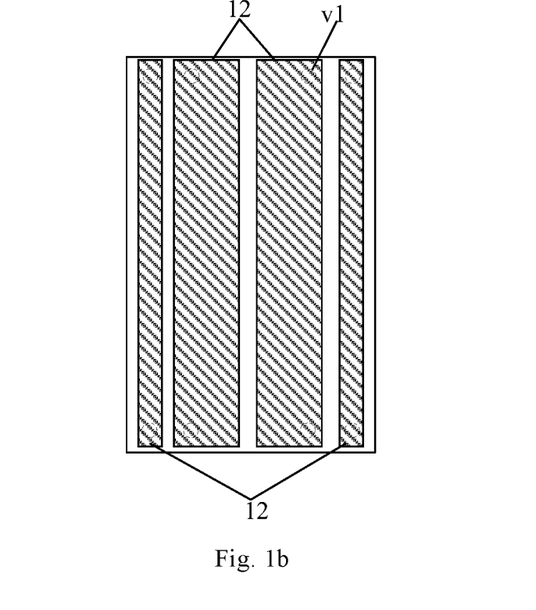
Figure 1C:
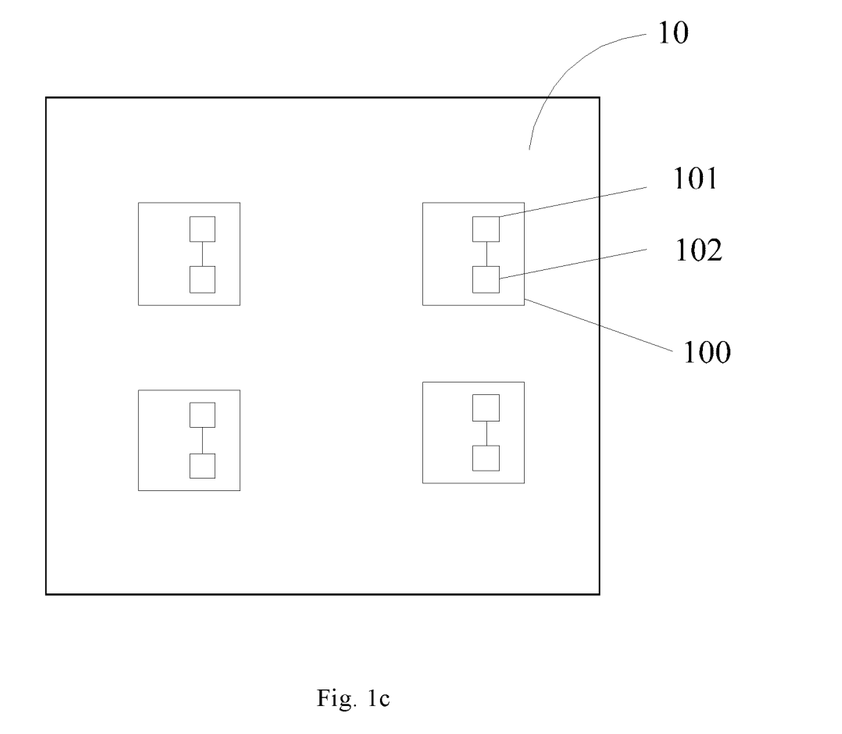

This array substrate is applicable to an Organic Light Emitting Diode (OLED) display apparatus, that is, the base substrate 10 is further provided with organic light emitting units 101. The signal lines comprise a high level signal line VDD and/or a low level signal line VSS. Refer to FIG. 1c, the OLED display apparatus comprises a plurality of pixel units 100. Each pixel unit 100 comprises an organic light emitting unit 101 and a pixel driving circuit 102. The pixel driving circuit 102 is used to provide a driving current to the organic light emitting unit 101 to drive the organic light emitting unit 101 to emit light. The signal lines are electrically connected to the pixel driving circuit or are a part of the pixel circuit to provide electrical signals for the pixel circuit, so that the organic light emitting unit is driven to emit light. When the resistance of the high level signal line VDD and/or the low level signal line VSS is reduced, the partial voltage on the high level signal line VDD and/or the low level signal line VSS is reduced. Differences between signals received at high level signal terminals and low level signal terminals of pixel driving circuits at different regions are reduced, and the difference between drive currents which are provided from pixel drive circuits of different regions to corresponding organic light emitting unit are reduced, so that the display uniformity can be improved, resulting in a better display effect.

It can be understood that a same signal line can be parallel-connected with one electrically conductive element 12, or can be parallel-connected with a plurality of electrically conductive elements 12 simultaneously. Refer to FIGS. 1a and 1b, two portions of the high level signal line VDD are parallel-connected with two electrically conductive elements 12 respectively, and two portions of the low level signal line VSS are also parallel-connected with two electrically conductive elements 12 respectively. In this case, in order to make the distribution of resistance of the high level signal line and the low level signal line more uniform after parallel connection, with the high level signal line VDD as an example, if the original resistance values of the two portions of the high level signal line VDD are the same, the two corresponding electrically conductive elements 12 are configured to have the same shape and size (the two electrically conductive elements 12 on the left and right sides of FIG. 1b have the same size and shape; the two electrically conductive elements 12 in the middle have the same size and shape), so that different portions of the high level signal line VDD have the same resistance values after the parallel connection with electrically conductive elements 12.

Since there are many lines disposed on the array substrate, in order to prevent affecting other signal lines or conductive structures by the provision of the electrically conductive elements 12, the electrically conductive elements 12 and the signal lines can be disposed in different layers that are insulated with one another. For example, refer to FIGS. 1a to 3b, the signal lines and the electrically conductive elements 12 are disposed on two sides of the base substrate 10 along its thickness direction respectively. At least two first vias V1 are formed in a region corresponding to each signal line on the base substrate 10. First connectors 11 corresponding to the respective first vias V1 are further provided on the base substrate 10. Each of the first connectors 11 passes through the first via to connect the signal line in parallel with a corresponding electrically conductive element 12. When the signal lines and the electrically conductive elements 12 are disposed on two sides of the base substrate 10, the base substrate 10 may function as a supporting and insulating element, so that the array substrate has a small thickness while reducing the resistance of the signal lines.

The material of the electrically conductive element 12 may be a transparent conductive material or a non-transparent conductive material. As described above, this array substrate is particularly suitable for an organic light emitting display apparatus. In this case, even if the electrically conductive element 12 is made of a non-transparent material, the display effect will not be affected. For example, the material for forming the electrically conductive element 12 may comprise metal materials having good electrical conductivity, such as copper or copper alloy, aluminum or aluminum alloy, or the like, or a non-metal conductive material, for example, a transparent conductive material such as ITO, or other conductive materials, such as a dual layered structure of conductive materials of copper and graphite.

For the convenience of forming vias on the base substrate 10, for example, the base substrate 10 is a flexible base substrate. Other materials may comprise polyimide (PI). When the first via v1 is formed, a laser drilling method may be used, and the present embodiment is not limited to the laser used.

Figure 2A:
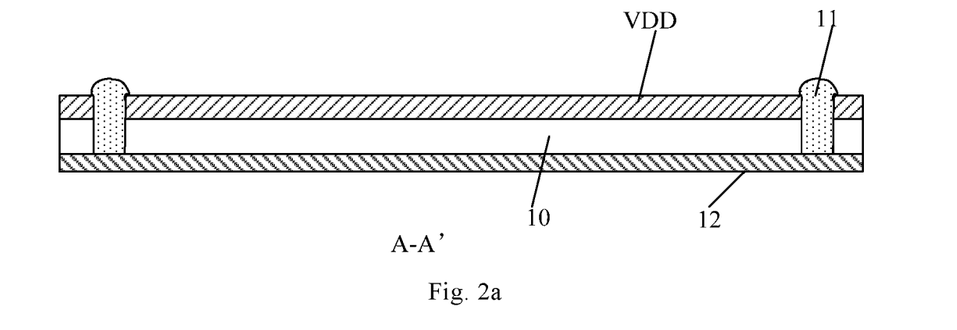
Figure 2B:
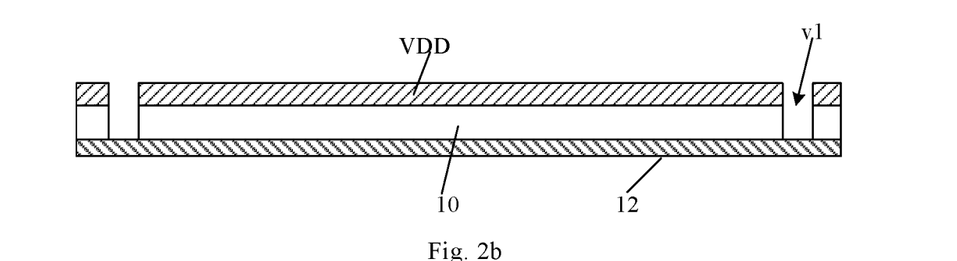

For example, the signal line can be parallel-connected with the electrically conductive element 12 in a non-display region of the array substrate, i.e., the first via V1 and the first connector 11 that are used to parallel-connect the signal line with the electrically conductive element 12 are disposed in a non-display region. In the fabrication process, first, structures such as signal lines, a thin film transistor array, and organic light emitting units can be formed on the base substrate 10. Then, first vias v1 (shown in FIG. 2b) that simultaneously penetrate the signal lines and the base substrate 10 are formed by laser drilling. Next, a electrically conductive element 12 is formed on the other side of the base substrate 10 by attaching a metal layer. At last, first connectors 11 are formed in positions corresponding each of first vias v1, so that the first connector 11 electrically connects the signal line with a corresponding electrically conductive element 12 through the first via v1 (as shown in FIG. 2a).

The first connector 11 may comprise an electrically conductive silver paste. In the above fabrication process, it is allowed to directly drip into the first via v1 penetrating the signal line and the base substrate without the need of patterning, so that the fabrication process can be simplified. Certainly, the first via v1 may only penetrate the base substrate 10 and is disposed beside the signal line. In this case, a conductive film layer structure can be used for the first connector 11, with one end disposed on the signal line and connected with the signal line, the end deposited in the first via v1 to connect with the electrically conductive element 12.

Figure 4A:
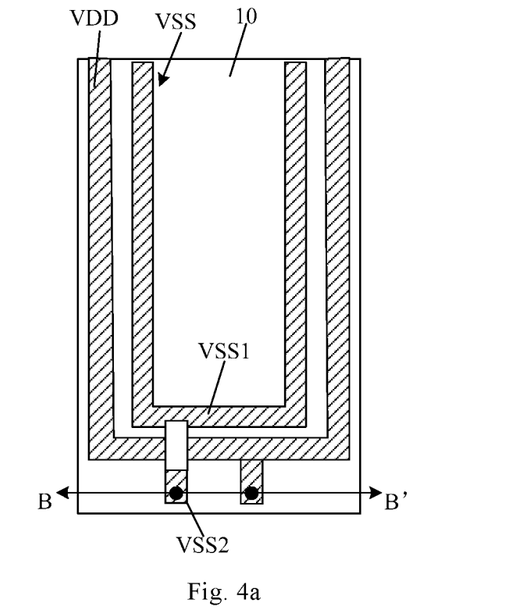
FIG. 4a is a front view of the structure of an array substrate provided in a third embodiment of the present disclosure.
Figure 4B:
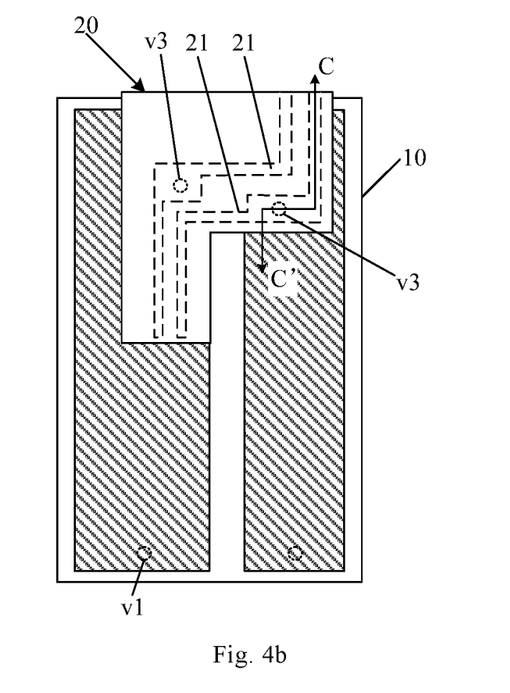

For example, the signal line may further comprise a signal transmission section VSS1 and a connection section VSS2 (as shown in FIGS. 1a and 4a). The signal transmission section VSS1 is electrically connected with the connection section VSS2. The first via can be disposed in a position corresponding to the signal transmission section VSS1, so that the first connector 11 connects the signal transmission section VSS1 with the electrically conductive element 12 through the first via v1. It also can be disposed in a position corresponding to the connection section VSS2, so that the first connector 11 connects the connection section VSS2 with the electrically conductive element 12 through the first via v1.

Figure 3A:
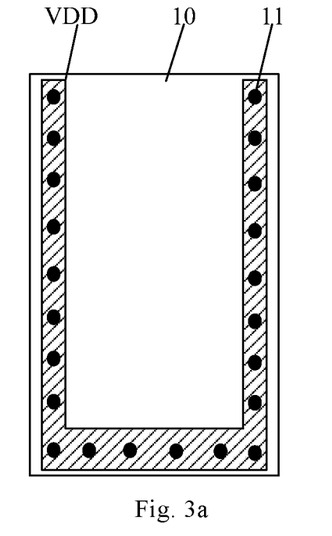
FIG. 3a is a front view of the structure of an array substrate provided in a second embodiment of the present disclosure.
Figure 3B:
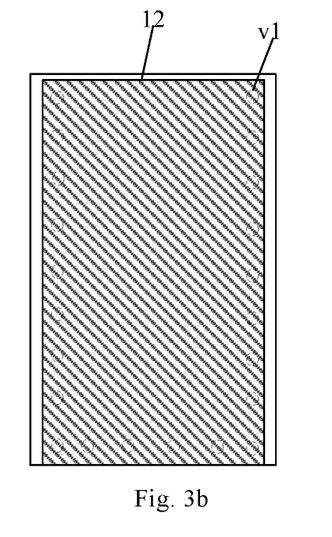

As shown in FIG. 3a, if the signal line comprises only a high level signal line VDD, the electrically conductive element 12 may be formed as an entire film layer on the base substrate 10, so that the resistance of the signal line can be reduced to a greater extent. A plurality of first vias v1 are uniformly disposed in positions on the base substrate 10 corresponding to the signal line. In a case that the signal lines comprise a high level signal line VDD and a low level signal line VSS, the area of the base substrate 10 that is covered by the high level signal line VDD and the low level signal line VSS can be as large as possible to reduce its resistance as much as possible while ensuring insulation intervals of the electrically conductive elements 12 corresponding to the high level signal line VDD and the low level signal line VSS respectively, so that the resistance of the high level signal line VDD parallel-connected with the electrically conductive element 12 and the resistance of the low level signal line VSS parallel-connected with the electrically conductive element 12 can be reduced as much as possible.

Of course, in addition to the structure in which the electrically conductive element 12 and the signal line are disposed on two sides of the base substrate 10 respectively, the electrically conductive element 12 and the signal lines can also be disposed on the same side of the base substrate 10 along its thickness direction, and the electrically conductive element 12 and the signal lines can be disposed in different layers (not corresponding drawing is provided). An insulation and spacing layer is provided between the electrically conductive element 12 and the signal lines. At least two second vias are formed in a region on the insulation and spacing layer corresponding to each signal line. Second connectors corresponding to respective second vias are further provided on the base substrate 10. Each second connector passes through the via to connect the signal line in parallel with a corresponding electrically conductive element 12. Similar to the first via, the second via may also penetrate both the insulation and spacing layer and the signal line, and the second connector may also be an electrically conductive silver paste injected in the second via.

Another embodiment of the present disclosure provides a display apparatus comprising the array substrate described above. The base substrate 10 of the array substrate is provided with signal lines and corresponding electrically conductive elements 12, the signal lines being parallel-connected with corresponding electrically conductive elements 12. Further, the array substrate may comprise an organic light emitting unit. In this case, the signal line comprises a high level signal line VDD and a low level signal line VSS. The display apparatus may further comprise an encapsulation layer for encapsulating a display region of the array substrate.

A first exemplary structure of the display apparatus can be described as follows. As mentioned above, in the array substrate, the signal lines and the electrically conductive elements 12 are disposed on two sides of the base substrate 10 respectively. At least two first vias V1 are formed at locations on the base substrate 10 corresponding to the signal lines. First connectors 11 are further provided on the base substrate 10. The first connectors 11 pass through the first vias to connect the signal lines in parallel with the electrically conductive elements 12. Or the signal lines and the electrically conductive elements 12 are both provided on the same side of the base substrate 10. An insulation and spacing layer is provided between the signal lines and the electrically conductive elements 12. A plurality of second vias are provided in the insulation and spacing layer. The signal lines are connected to the electrically conductive elements 12 by second connectors passing through the second vias.

A second exemplary structure of the display apparatus can be described as follows. As shown in FIGS. 4a to 5b, the display apparatus comprises an array substrate and a flexible circuit broad 20. In the array substrate, signal lines (high level signal line VDD and low level signal line VSS in FIG. 4a) and electrically conductive elements 12 are provided on two sides of the base substrate 10 along its thickness direction, respectively. The flexible circuit board 20 is connected to the array substrate and a driving circuit board (not shown), so that the driving circuit board provides driving signals to the array substrate through the flexible circuit board 20. The flexible circuit board 20 comprises connection lines 21 corresponding to the signal lines. One end of the signal line is connected to the electrically conductive element 12 through a corresponding connection line 21 on the flexible circuit board. For example, a portion of the flexible circuit broad 20 is disposed on the side of the base substrate 10 where the signal lines are formed and is electrically connected to the signal lines. Another portion of the flexible circuit broad 20 is folded to the side of the base substrate 10 where the electrically conductive elements 12 are formed and is electrically connected to the electrically conductive elements 12.

Another end of the signal line is connected to the electrically conductive element 12 through at least one first via. For example, first vias V1 are formed on the base substrate 10 and correspond to the signal lines. The first vias v1 penetrate the base substrate 10. First connectors 11 are further provided on the base substrate 10 corresponding to the first vias V1, respectively. Each of the first connectors 11 passes through the first via v1 to connect a portion of the signal line that is not connected to the connection line 21 to a corresponding electrically conductive element 12.

Note that "first vias v1 corresponding to the signal lines" may comprise several conditions. For example, the first via v1 penetrates a portion of the signal line that is not connected to the connection line 21 and the base substrate 10 simultaneously; or the first via v1 is provided beside the signal line.

Thus, in the first structure of the display apparatus, the signal lines are parallel-connected to the electrically conductive elements 12 by first connectors 11 in two or more first vias v1. In the second structure of the display apparatus, the signal lines are parallel-connected to the electrically conductive elements 12 by the first connectors 11 in the first vias v1 and the connection lines 21 on the flexible circuit board 20. In the second structure, the base substrate 10 is also a flexible base substrate to facilitate producing the vias.

Figure 5A:
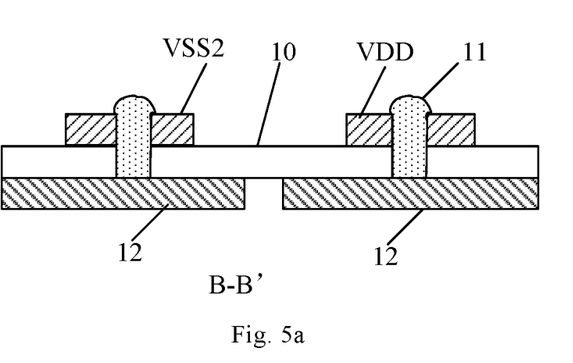
Figure 5B:
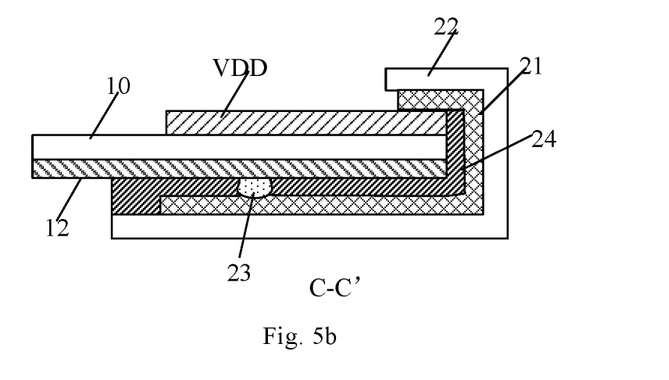
FIG. 5b is the sectional view along the line C-C' as shown in FIG. 4b.

For example, in the second structure of the display apparatus, as shown in FIG. 5b, the flexible circuit board 20 comprises a flexible base 22, a connection line 21 is provided on one side of the flexible base 22 facing the array substrate. An insulation layer 24 is further provided on the flexible base 22. The insulation layer 24 covers the connection line 21 and exposes a first predetermined connection region and a second predetermined connection region. The first predetermined connection region is a region connected to the signal line. The second predetermined connection region is a region connected to the electrically conductive element 12. The second predetermined connection region is connected to the electrically conductive element 12 by a third connector 23. Wherein, both of the first connector 11 and the third connector 23 may comprise an electrically conductive silver paste.

As known from the above description of the array substrate and display apparatus provided in the embodiments of the present disclosure, due to the parallel-connection of the signal lines and the electrically conductive elements, it is equivalent to parallel-connecting the signal lines to a resistor, so that the resistance of the signal lines can be reduced. In the organic light emitting display apparatus, the signal lines may be a high level signal line and a low level signal line, the partial voltage over the signal line can be reduced due to the reduction in the resistance of the signal line, so that there are smaller differences in the driving current of the organic light emitting units in pixel units at different positions on the array substrate, and the display uniformity can be improved. In addition, the signal lines and the electrically conductive elements can be provided on two sides of the base substrate, so that the base substrate may function as both supporting and insulating element, therefore the display apparatus has a smaller thickness while reducing the resistance of the signal line.

The above are only preferred embodiments of the present disclosure and are not intended to limit the present disclosure. The protective scope of the invention is therefore defined by the appended claims.

The invention claimed is:

1. An array substrate, comprising a base substrate and signal lines provided on the base substrate, wherein electrically conductive elements corresponding to the signal lines are further provided on the base substrate, the signal lines are each connected in parallel with a corresponding one of the electrically conductive elements, and the electrically conductive elements corresponding to different signal lines are insulated and spaced apart from one another, wherein the signal lines and the electrically conductive elements are disposed on two sides of the base substrate along its thickness direction respectively; at least two vias are formed in a region on the base substrate corresponding to each of the signal lines; connectors corresponding to the at least two vias are further provided on the base substrate; and each of the connectors passes through a corresponding one of the at least two vias to connect a corresponding one of the signal lines in parallel with a corresponding one of the electrically conductive elements.

2. The array substrate according to claim 1, wherein an organic light emitting unit is further provided on the base substrate, and the signal lines comprise a high level signal line and/or a low level signal line.

3. The array substrate according to claim 1, wherein the base substrate is a flexible base substrate.

4. The array substrate according to claim 1, wherein a first connector of the connectors comprises an electrically conductive silver paste.

5. The array substrate according to claim 1, wherein a material of each of the electrically conductive elements comprises a two-layer structure of conductive materials of copper and graphite.

6. A display apparatus, comprising the array substrate according to claim 1.

7. A display apparatus, comprising an array substrate, wherein the array substrate comprises a base substrate and signal lines provided on the base substrate, electrically conductive elements corresponding to the signal lines are further provided on the base substrate, the signal lines are each connected in parallel with a corresponding one of the electrically conductive elements, and the electrically conductive elements corresponding to different signal lines are insulated and spaced apart from one another, wherein the signal lines and the electrically conductive elements are disposed on two sides of the base substrate along its thickness direction respectively; and the display apparatus further comprises a flexible circuit broad comprising connection lines corresponding to the signal lines, one end of a first signal line of the signal lines being connected to a corresponding one of the electrically conductive elements by a corresponding connection line on the flexible circuit broad, another end of the first signal line being connected to the corresponding one of the electrically conductive elements through at least one via.

8. The display apparatus according to claim 7, wherein a portion of the flexible circuit broad is disposed on a side of the base substrate where the signal lines are formed and is electrically connected to the signal lines, another portion of the flexible circuit broad is folded to a side of the base substrate where the electrically conductive elements are formed and is electrically connected to the electrically conductive elements.

9. The display apparatus according to claim 8, wherein the flexible circuit broad comprises a flexible base; the connection lines are disposed on a side of the flexible base facing the array substrate; an insulation layer is further provided on the flexible base; the insulation layer covers the connection lines and exposes a first predetermined connection region and a second predetermined connection region; the first predetermined connection region is a region connected to the signal lines; and the second predetermined connection region is a region connected to the electrically conductive elements; the second predetermined connection region is connected to the electrically conductive elements by connectors.

10. The display apparatus according to claim 9, wherein each of the connectors comprises an electrically conductive silver paste.

11. The display apparatus according to claim 8, wherein the at least one via is formed on the base substrate and corresponds to one of the signal lines; connectors are further provided on the base substrate corresponding to the at least one via; and each of the connectors passes through a corresponding one of the at least one via to connect a portion of a corresponding one of the signal lines that is not connected to a corresponding one of the connection lines to a corresponding one of the electrically conductive elements.

12. The display apparatus according to claim 7, wherein the base substrate of the array substrate is a flexible base substrate.

* * * * *